(12) United States Patent
Lee

(10) Patent No.: US 10,714,405 B2
(45) Date of Patent: *Jul. 14, 2020

(54) SEMICONDUCTOR PACKAGES RELATING TO THERMAL REDISTRIBUTION PATTERNS

(71) Applicant: SK hynix Inc., Incheon-si, Gyeonggi-do (KR)

(72) Inventor: Dae Woong Lee, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/529,548

(22) Filed: Aug. 1, 2019

(65) Prior Publication Data

US 2019/0355645 A1 Nov. 21, 2019

Related U.S. Application Data

(63) Continuation of application No. 16/036,242, filed on Jul. 16, 2018, now Pat. No. 10,410,947.

(30) Foreign Application Priority Data

Nov. 15, 2017 (KR) .......................... 10-2017-0152636

(51) Int. Cl.
*H01L 23/367* (2006.01)
*H01L 23/373* (2006.01)
(Continued)

(52) U.S. Cl.
CPC ........ *H01L 23/367* (2013.01); *H01L 23/3735* (2013.01); *H01L 23/3736* (2013.01); *H01L 24/32* (2013.01); *H01L 25/18* (2013.01); *H01L 2924/1431* (2013.01); *H01L 2924/1436* (2013.01); *H01L 2924/15311* (2013.01)

(58) Field of Classification Search
CPC ....... H01L 23/367; H01L 24/32; H01L 25/18; H01L 23/3735; H01L 25/042; H01L 25/0655; H01L 25/072; H01L 25/073; H01L 25/115
See application file for complete search history.

(56) References Cited

U.S. PATENT DOCUMENTS 5,616,957 A * 4/1997 Kajihara ............. H01L 23/4334
257/712
5,819,402 A * 10/1998 Edwards ................. H01L 23/42
29/840

(Continued)

FOREIGN PATENT DOCUMENTS

KR 1020110004119 A 1/2011

*Primary Examiner* — Syed I Gheyas
(74) *Attorney, Agent, or Firm* — William Park & Associates Ltd.

(57) ABSTRACT

A semiconductor package may include a first semiconductor chip, a second semiconductor chip, and a thermal redistribution pattern which are disposed on a package substrate. The thermal redistribution pattern may include a first end portion disposed in a high temperature region adjacent to the first semiconductor chip, a second end portion disposed in a low temperature region adjacent to the second semiconductor chip, and an extension portion connecting the first end portion to the second end portion.

20 Claims, 10 Drawing Sheets

(51) Int. Cl.
  *H01L 23/00* (2006.01)
  *H01L 25/18* (2006.01)

(56) References Cited

U.S. PATENT DOCUMENTS

| | | | | |
|---|---|---|---|---|
| 6,190,945 B1 * | 2/2001 | Akram | ................... | H01L 21/563 |
| | | | | 257/E21.503 |
| 6,849,940 B1 * | 2/2005 | Chan | ....................... | H01L 23/16 |
| | | | | 257/675 |
| 6,933,602 B1 * | 8/2005 | Patel | ................... | H01L 23/3128 |
| | | | | 257/675 |
| 6,979,894 B1 * | 12/2005 | Sutardja | .............. | H01L 23/3675 |
| | | | | 257/532 |
| 7,031,162 B2 * | 4/2006 | Arvelo | ................. | H01L 23/433 |
| | | | | 361/718 |
| 7,176,579 B2 * | 2/2007 | Konishi | .............. | H01L 23/3121 |
| | | | | 257/724 |
| 7,205,651 B2 * | 4/2007 | Do | ..................... | H01L 25/0657 |
| | | | | 257/686 |
| 7,683,469 B2 * | 3/2010 | Oh | ........................ | H01L 23/367 |
| | | | | 257/675 |
| 8,202,765 B2 * | 6/2012 | Casey | .................... | H01L 23/04 |
| | | | | 438/122 |
| 8,362,607 B2 * | 1/2013 | Scheid | ................ | H01L 23/3675 |
| | | | | 257/707 |
| 8,375,576 B2 * | 2/2013 | Kwon | ................. | H01L 23/4334 |
| | | | | 174/261 |
| 8,558,372 B2 * | 10/2013 | Negoro | .................. | H01L 23/13 |
| | | | | 257/707 |
| 8,564,957 B2 * | 10/2013 | Usui | .................. | H05K 7/20509 |
| | | | | 165/104.33 |
| 8,576,566 B2 * | 11/2013 | Lev | .......................... | G06F 1/20 |
| | | | | 165/185 |
| 10,062,664 B2 * | 8/2018 | Hsieh | ................... | H01L 23/433 |
| 2001/0008776 A1 * | 7/2001 | Lai | ..................... | H01L 23/4334 |
| | | | | 438/106 |
| 2002/0084523 A1 * | 7/2002 | Sorimachi | .......... | H01L 23/4334 |
| | | | | 257/713 |
| 2003/0116836 A1 * | 6/2003 | Huang | ............... | H01L 23/3128 |
| | | | | 257/678 |
| 2004/0099944 A1 * | 5/2004 | Kimura | .............. | H01L 23/4334 |
| | | | | 257/706 |
| 2011/0018119 A1 * | 1/2011 | Kim | ................... | H01L 23/3128 |
| | | | | 257/690 |
| 2014/0097532 A1 | 4/2014 | Chiang et al. | | |
| 2015/0132894 A1 | 5/2015 | Mohammed et al. | | |
| 2015/0340303 A1 * | 11/2015 | Oh | ........................ | H01L 21/486 |
| | | | | 257/692 |
| 2016/0118366 A1 | 4/2016 | Jang | | |

\* cited by examiner

SEMICONDUCTOR PACKAGES RELATING TO THERMAL REDISTRIBUTION PATTERNS

CROSS-REFERENCE TO RELATED APPLICATIONS

The present application is a continuation application of U.S. patent application Ser. No. 16/036,242, filed on Jul. 16, 2018, and claims priority under 35 U.S.C. 119(a) to Korean Application No. 10-2017-0152636, filed on Nov. 15, 2017, which is incorporated herein by references in its entirety.

BACKGROUND

1. Technical Field

The present disclosure generally relates to semiconductor package technologies and, more particularly, to semiconductor packages relating to thermal redistribution patterns.

2. Related Art

Multi chip packages (MCPs) have been developed to integrate various types of semiconductor chips into a single package. The various types of semiconductor chips embedded in each of the MCPs may have different functions. System-in-packages (SiPs) among the MCPs have been proposed to provide high performance packages. Each of the SiPs may be configured to include a logic chip and at least one memory chip.

As each of the MCPs employs various types of semiconductor chips, the MCPs have exhibited a poor thermal characteristic. That is, the various semiconductor chips employed in each of the MCPs may consume electric power differently. Accordingly, quantities of heat generated by the semiconductor chips in each of the MCPs may also be different from each other. A high power semiconductor chip consuming relatively high electric power may generate a relatively large amount of heat as compared with a low power semiconductor chip consuming relatively low electric power. The heat generated by the high power semiconductor chip may be locally accumulated in a certain region of the MCP. Thus, the certain region of the MCP may be excessively heated up to provide a high temperature region. The high temperature region may degrade characteristics of the semiconductor chips in the MCP.

SUMMARY

According to an embodiment, a semiconductor package may be provided. The semiconductor package may include a first semiconductor chip, a second semiconductor chip and a thermal redistribution pattern which are disposed on a package substrate. The first and second semiconductor chips may be spaced apart from each other. The thermal redistribution pattern may include a first end portion disposed in a high temperature region adjacent to the first semiconductor chip, a second end portion disposed in a low temperature region adjacent to the second semiconductor chip, and an extension portion connecting the first end portion to the second end portion.

According to an embodiment, a semiconductor package may be provided. The semiconductor package may include a first semiconductor chip, a second semiconductor chip and a thermal redistribution pattern disposed on a package substrate. The first and second semiconductor chips may be spaced apart from each other. The thermal redistribution pattern may include a first end portion disposed in a high temperature region adjacent to the first semiconductor chip, a second end portion disposed in a low temperature region adjacent to the second semiconductor chip, and a plurality of sub-extension portions which are arrayed along a path between the first end portion and the second end portion, the plurality of sub-extension portions spaced part from each other.

According to an embodiment, a semiconductor package may be provided. The semiconductor package may include a first semiconductor chip and a second semiconductor chip disposed on a package substrate and the first and second semiconductor chips spaced apart from each other. The semiconductor package may include a thermal redistribution pattern including a first end portion disposed adjacent to the first semiconductor chip, a second end portion disposed adjacent to the second semiconductor chip, and an extension portion connected to the first end portion and the second end portion, and configured to reduce a bottleneck phenomenon of heat transmission when transferring heat from the first end portion to the second end portion.

DETAILED DESCRIPTION

Figure 1:
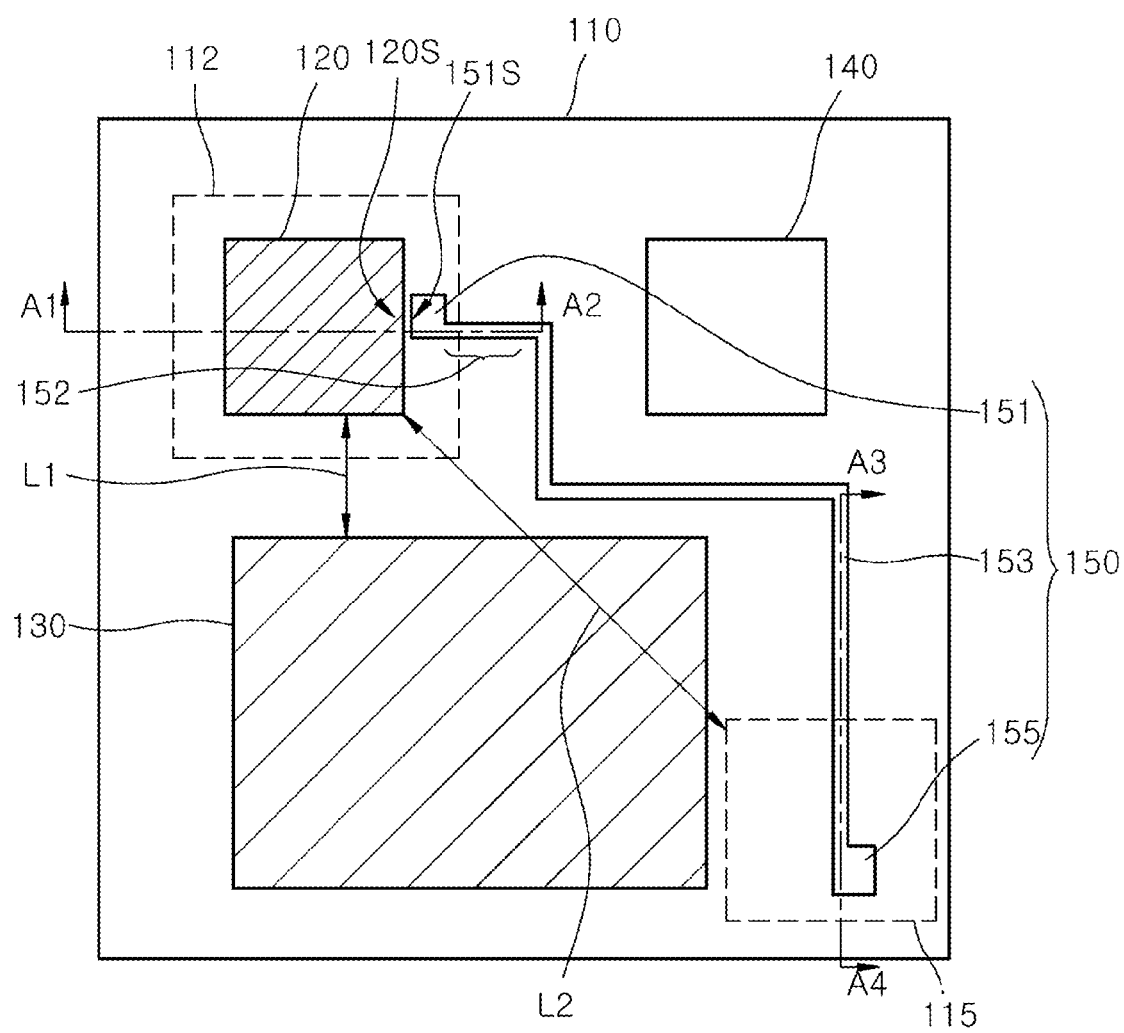
FIG. 1 is a plan view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Various embodiments of the present disclosure will be described hereinafter with reference to the accompanying drawings. Same reference numerals refer to same elements throughout the specification. Even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

The present disclosure may provide semiconductor packages including thermal redistribution patterns to conduct heat from a high temperature region to a low temperature region.

Figure 2:
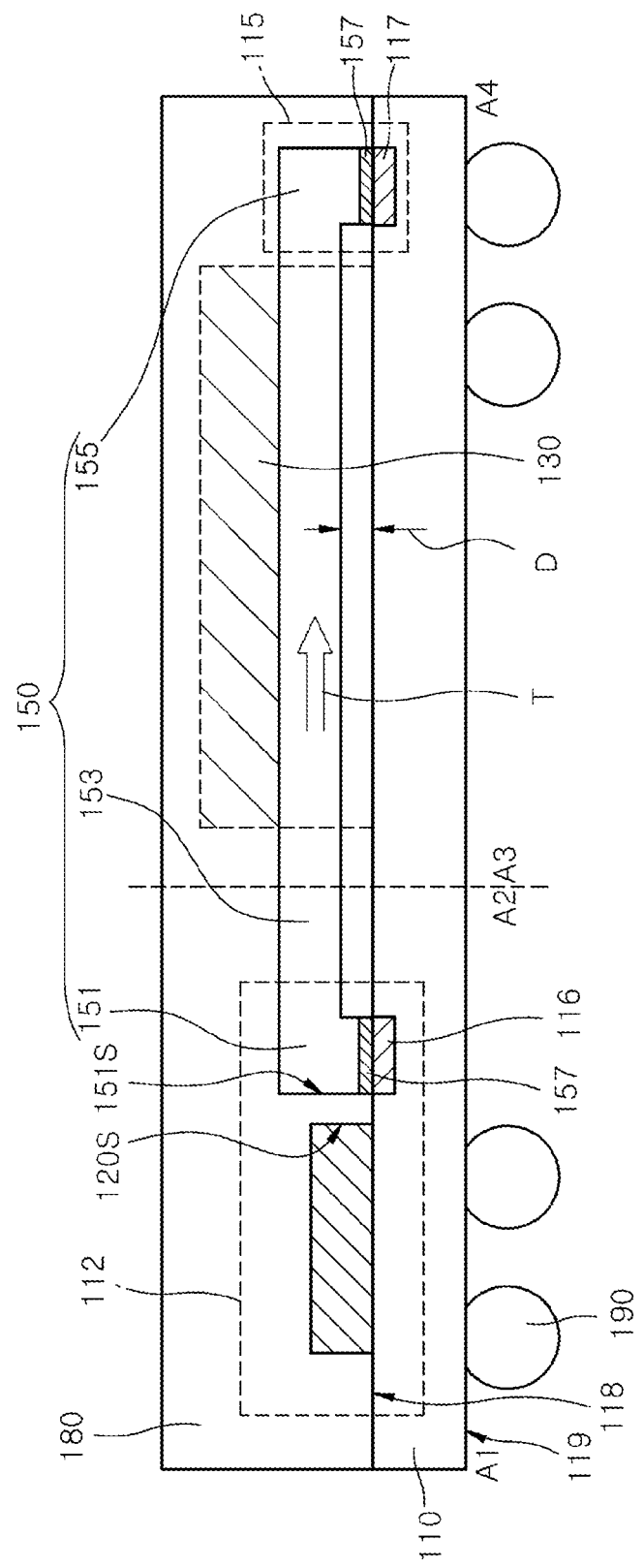
FIG. 2 is a merged cross-sectional view taken along lines A1-A2 and A3-A4 of FIG. 1.

FIG. 1 is a plan view illustrating a semiconductor package 100 according to an embodiment. FIG. 2 is a merged cross-sectional view taken along lines A1-A2 and A3-A4 of FIG. 1.

Referring to FIG. 1, the semiconductor package 100 may be configured to have an MCP form including a plurality of semiconductor chips, for example, first to third semiconductor chips 120, 130 and 140 mounted on a package substrate 110. The first to third semiconductor chips 120, 130 and 140 may have different functions. In such a case, the semiconductor package 100 may correspond to a system-in-package (SiP). The package substrate 110 may be configured to include circuit interconnection lines for connecting the semiconductor chips 120, 130 and 140 to each other or for connecting the semiconductor chips 120, 130 and 140 to an external device. The package substrate 110 may be a printed circuit board (PCB).

The first semiconductor chip 120 may be a system-on-chip (SoC) such as an application processor (AP). The first semiconductor chip 120 may be a logic chip such as a controller. The second semiconductor chip 130 may have a function which is different from a function of the first semiconductor chip 120. For example, the second semiconductor chip 130 may be a memory chip storing data. In an embodiment, the second semiconductor chip 130 may be a nonvolatile memory chip such as a NAND-type memory chip. The third semiconductor chip 140 may have a function which is different from a function of the first semiconductor chip 120 or the second semiconductor chip 130. For example, the third semiconductor chip 140 may be a DRAM chip storing data. In such a case, the DRAM chip corresponding to the third semiconductor chip 140 may act as a buffer memory chip while the first semiconductor chip 120, that is, the application processor (AP) operates.

Referring to FIGS. 1 and 2, the second and third semiconductor chips 130 and 140 may be disposed on the package substrate 110 to be spaced apart from the first semiconductor chip 120. A molding layer 180 may be disposed to cover a first surface 118 of the package substrate 110. The molding layer 180 may extend to cover the first to third semiconductor chips 120, 130 and 140 which are disposed on the first surface 118 of the package substrate 110. The first to third semiconductor chips 120, 130 and 140 may be protected by the molding layer 180. The first to third semiconductor chips 120, 130 and 140 may be disposed between the molding layer 180 and the package substrate 110 to be embedded in the molding layer 180. Outer connectors 190 may be disposed on a second surface 119 of the package substrate 110 opposite to the semiconductor chips 120, 130 and 140 to electrically connect the semiconductor package 100 to an external device. The outer connectors 190 may include solder balls.

The first semiconductor chip 120 such as a processor chip may correspond to a high power chip that consumes relatively high electric power as compared with the second and third semiconductor chips 130 and 140. Thus, the first semiconductor chip 120 may be a chip that generates a relatively large amount of heat as compared with the second and third semiconductor chips 130 and 140. Each of the second and third semiconductor chips 130 and 140 such as memory chips may correspond to a low power chip that consumes relatively low electric power as compared with the first semiconductor chip 120. Thus, each of the second and third semiconductor chips 130 and 140 may generates a relatively small amount of heat as compared with the first semiconductor chip 120.

The heat generated by the first semiconductor chip 120 may be accumulated in a region surrounding the first semiconductor chip 120 due to the presence of the molding layer 180 covering the first semiconductor chip 120. Since the first semiconductor chip 120 is disposed between the molding layer 180 and the package substrate 110, the molding layer 180 or the package substrate 110 may block the heat emission from the first semiconductor chip 120. Accordingly, most of the heat generated by operation of the first semiconductor chip 120 may be accumulated in a region surrounding the first semiconductor chip 120. As a result, while the first semiconductor chip 120 operates, the region surrounding the first semiconductor chip 120 may be excessively heated up to become a high temperature region 112.

The molding layer 180 may be formed to include an encapsulant such as an epoxy molding compound (EMC) material. The EMC material may have a thermal conductivity which is lower than a thermal conductivity of a metal material such as a copper material. For example, the EMC material may have a thermal conductivity of approximately 0.3 W/mK while the copper material has a thermal conductivity of approximately 390 W/mK.

As such, since the molding layer 180 has a relatively low thermal conductivity, the molding layer 180 may disrupt the heat accumulated in the high temperature region 112 from being emitted into an outside region of the high temperature region 112. Thus, the heat generated by the first semiconductor chip 120 may not be easily radiated toward an outside region of the high temperature region 112 and may be locally accumulated in the high temperature region 112. Accordingly, a temperature of the high temperature region 112 may rise up because of the heat generated by the first semiconductor chip 120.

Since the package substrate 110 includes an epoxy resin material or the like, the package substrate 110 may have a relatively low thermal conductivity. Thus, the emission of the heat generated by the first semiconductor chip 120 may also be blocked by the package substrate 110, and the temperature of the high temperature region 112 may excessively rise.

The semiconductor package 100 according to an embodiment may be configured to include a thermal redistribution pattern 150 embedded in the molding layer 180. As illustrated in FIG. 2, the thermal redistribution pattern 150 in the semiconductor package 100 may act as a thermal transferring path T through which heat is conducted at a speed which is higher than a heat conduction speed of the molding layer 180. The thermal redistribution pattern 150 may be disposed to conduct the heat accumulated in the high temperature region 112 of the semiconductor package 100 to a low temperature region 115 having a relatively low temperature in the semiconductor package 100. That is, the thermal redistribution pattern 150 may provide a path that spreads or disperses heat accumulated in a specific region to another region. Since the heat in the high temperature region 112 can be radiated through the thermal redistribution pattern 150 at a high speed, the temperature of the high temperature region 112 may be more readily lowered. That is, the heat in the semiconductor package 100 may be easily dispersed faster because of the presence of the thermal redistribution pattern 150.

The thermal redistribution pattern 150 may be formed to include a heat transferring material having a thermal conductivity which is higher than an encapsulant of the molding layer 180. The thermal redistribution pattern 150 may include a metal material such as a copper material. The thermal redistribution pattern 150 may be comprised of a bar pattern or a line pattern that includes one end portion 151 (i.e., first end portion) and the other end portion 155 (i.e., second end portion) which are opposite to each other as well as an extension portion 153 which connects the end portions 151 and 155 to each other.

The one end portion 151 of the thermal redistribution pattern 150 may be disposed in the high temperature region 112 surrounding the first semiconductor chip 120 that generates a relatively large amount of heat. The one end portion 151 of the thermal redistribution pattern 150 may be disposed to be adjacent to the first semiconductor chip 120. The one end portion 151 of the thermal redistribution pattern 150 may be disposed so that a side surface 151S of the one end portion 151 faces a side surface 120S of the first semiconductor chip 120. In an embodiment, the one end portion 151 of the thermal redistribution pattern 150 may be disposed so that the side surface 151S of the one end portion 151 is in contact with the side surface 120S of the first semiconductor chip 120. Alternatively, as illustrated in FIGS. 1 and 2, the one end portion 151 of the thermal redistribution pattern 150 may be disposed so that the side surface 151S of the one end portion 151 is spaced apart from the side surface 120S of the first semiconductor chip 120.

Heat of a first element may be conducted to a second element even though the first and second elements are spaced apart from each other, unlike electricity. Thus, even though the first semiconductor chip 120 is spaced apart from the one end portion 151 of the thermal redistribution pattern 150, the heat of the first semiconductor chip 120 may be conducted to the one end portion 151 of the thermal redistribution pattern 150. In addition, the one end portion 151 of the thermal redistribution pattern 150 may be formed to be actually spaced apart from the first semiconductor chip 120 due to process tolerances of processes for attaching the first semiconductor chip 120 to the package substrate 110 and for forming the thermal redistribution pattern 150 on the package substrate 110.

A gap between the one end portion 151 of the thermal redistribution pattern 150 and the first semiconductor chip 120 may be filled with the molding layer 180. The molding layer 180 between the one end portion 151 of the thermal redistribution pattern 150 and the first semiconductor chip 120 may electrically insulate the first semiconductor chip 120 from the thermal redistribution pattern 150. The molding layer 180 between the one end portion 151 of the thermal redistribution pattern 150 and the first semiconductor chip 120 may act as a diffusion barrier layer that prevents metal atoms in the thermal redistribution pattern 150 from being diffused into the first semiconductor chip 120. Accordingly, the molding layer 180 may prevent the first semiconductor chip 120 from being contaminated by impurities such as metal atoms in the thermal redistribution pattern 150.

The other end portion 155 of the thermal redistribution pattern 150 may be disposed in the low temperature region 115 having a relatively low temperature. As illustrated in FIG. 1, the low temperature region 115 may be set as a region which is located far from the first semiconductor chip 120. The low temperature region 115 may be confined to be close to the second semiconductor chip 130 corresponding to a low power chip consuming relatively low electric power. The low temperature region 115 may be a region in which no semiconductor chip is disposed. The low temperature region 115 may be spaced apart from the first semiconductor chip 120 by a distance L2 which is greater than a distance L1 between the first and second semiconductor chips 120 and 130. The low temperature region 115 may correspond to a corner region of the semiconductor package 100, which is located to be farthest from the first semiconductor chip 120.

Since the low temperature region 115 is located far from the first semiconductor chip 120 corresponding to a high power chip and the high temperature region 112, a temperature of the low temperature region 115 may be relatively lower than a temperature of the high temperature region 112. Since the second semiconductor chip 130 corresponding to a low power chip is disposed to be adjacent to the low temperature region 115, the low temperature region 115 may have a relatively low temperature in the semiconductor package 100.

The extension portion 153 of the thermal redistribution pattern 150 may be a portion that physically connects the one end portion 151 to the other end portion 155. The extension portion 153 of the thermal redistribution pattern 150 may detour the second semiconductor chip 130 and may extend to the other end portion 155. The extension portion 153 of the thermal redistribution pattern 150 may be disposed to be spaced apart from the second semiconductor chip 130 to pass by the second semiconductor chip 130. Since heat is conducted along the extension portion 153 of the thermal redistribution pattern 150, the heat accumulated in the high temperature region 112 may be transmitted to the low temperature region 115 through the extension portion 153 of the thermal redistribution pattern 150. As such, the thermal redistribution pattern 150 may redistribute the heat in the semiconductor package 100.

The thermal redistribution pattern 150 may be disposed to be embedded in the molding layer 180. As illustrated in FIG. 2, the extension portion 153 of the thermal redistribution pattern 150 may be disposed to be spaced apart from the package substrate 110 by a certain distance D. Thus, the extension portion 153 of the thermal redistribution pattern 150 may be disposed to be surrounded by the molding layer 180. The molding layer 180 may extend to fill a gap between the extension portion 153 of the thermal redistribution pattern 150 and the package substrate 110. Since the extension portion 153 of the thermal redistribution pattern 150 is substantially separated from the package substrate 110 by the molding layer 180, the molding layer 180 may electrically insulate the extension portion 153 of the thermal redistribution pattern 150 from the package substrate 110.

Referring again to FIG. 2, the one end portion 151 of the thermal redistribution pattern 150 may be electrically connected to the package substrate 110. In addition, the other end portion 155 of the thermal redistribution pattern 150 may also be electrically connected to the package substrate 110. The package substrate 110 may include a first mounting pattern 116 in the high temperature region 112 and a second mounting pattern 117 in the low temperature region 115. The first and second mounting patterns 116 and 117 may be formed to include a metal material, for example, a copper material.

The one end portion 151 of the thermal redistribution pattern 150 may be bonded to the first mounting pattern 116 using a thermal adhesive layer 157. Thus, a portion of the heat generated by the first semiconductor chip 120 may be transmitted to the first mounting pattern 116 through a portion of the package substrate 110 overlapping with the first semiconductor chip 120, and the heat reaching the first mounting pattern 116 may be transmitted to the thermal redistribution pattern 150 through the thermal adhesive layer 157. Accordingly, the heat generated by the first semiconductor chip 120 may be transmitted to the low temperature region 115 rapidly. The thermal adhesive layer 157 may be an adhesive layer including a heat conduction material. The thermal adhesive layer 157 may include an adhesive material in which heat conductive beads such as silver beads are dispersed. The thermal adhesive layer 157 may include a thermal interface material. The thermal adhesive layer may include a solder material layer.

The other end portion 155 of the thermal redistribution pattern 150 may be bonded to the second mounting pattern 117 using the thermal adhesive layer 157. Thus, the heat reaching the low temperature region 115 through the thermal redistribution pattern 150 may be transmitted to the package substrate 110 through the second mounting pattern 117 bonded to the other end portion 155 and may be radiated through the package substrate 110.

As illustrated in FIG. 2, the thermal adhesive layer 157 may be disposed to bond only the one end portion 151 and the other end portion 155 of the thermal redistribution pattern 150 to the package substrate 110. Alternatively, the thermal adhesive layer 157 may extend to bond an entire portion of the extension portion 153 of the thermal redistribution pattern 150 to the package substrate 110. In such a case, although not illustrated in the drawings, the thermal adhesive layer 157 may have a film shape or a paste shape to be disposed at an interface between the extension portion 153 of the thermal redistribution pattern 150 and the package substrate 110.

A heat conduction characteristic of the thermal redistribution pattern 150 may excel as a thickness of the thermal redistribution pattern 150 increases. The heat conduction characteristic of the thermal redistribution pattern 150 may be linearly proportional to a thickness of the thermal redistribution pattern 150. The thermal redistribution pattern 150 may have a thickness which is substantially equal to or less than a thickness of the thickest one (e.g., the second semiconductor chip 130) among the first to third semiconductor chips 120, 130 and 140 disposed in the semiconductor package 100. The thermal redistribution pattern 150 may have a thickness which is substantially equal to or greater than a thickness of the first semiconductor chip 120 corresponding to a high power chip. As such, it may be necessary to limit a thickness of the thermal redistribution pattern 150 in order to guarantee or ensure that the molding layer 180 on the thermal redistribution pattern 150 has at least a certain thickness.

As described above, the thermal redistribution pattern 150 of the semiconductor package 100 may transmit heat in one region of the semiconductor package 100 to another region of the semiconductor package 100. Thus, the thermal redistribution pattern 150 may prevent the accumulation of heat in a specific region (e.g., the high temperature region 112) of the semiconductor package 100 to excessively increase a temperature of the specific region of the semiconductor package 100. If a temperature of the high temperature region 112 excessively rises up, a semiconductor chip adjacent to the high temperature region 112 may be heated up to degrade the performance of the adjacent semiconductor chip. However, according to the aforementioned embodiments, heat generated in a specific region of the semiconductor package 100 may be redistributed and spread out by the thermal redistribution pattern 150. Thus, the thermal redistribution pattern 150 may prevent that a specific region in the semiconductor package 100 is excessively and locally heated up to degrade performance of a semiconductor chip adjacent to the specific region. Heat distribution in the semiconductor package 100 and thermal characteristics of the semiconductor package 100 may be improved due to the presence of the thermal redistribution pattern 150.

Figure 3:
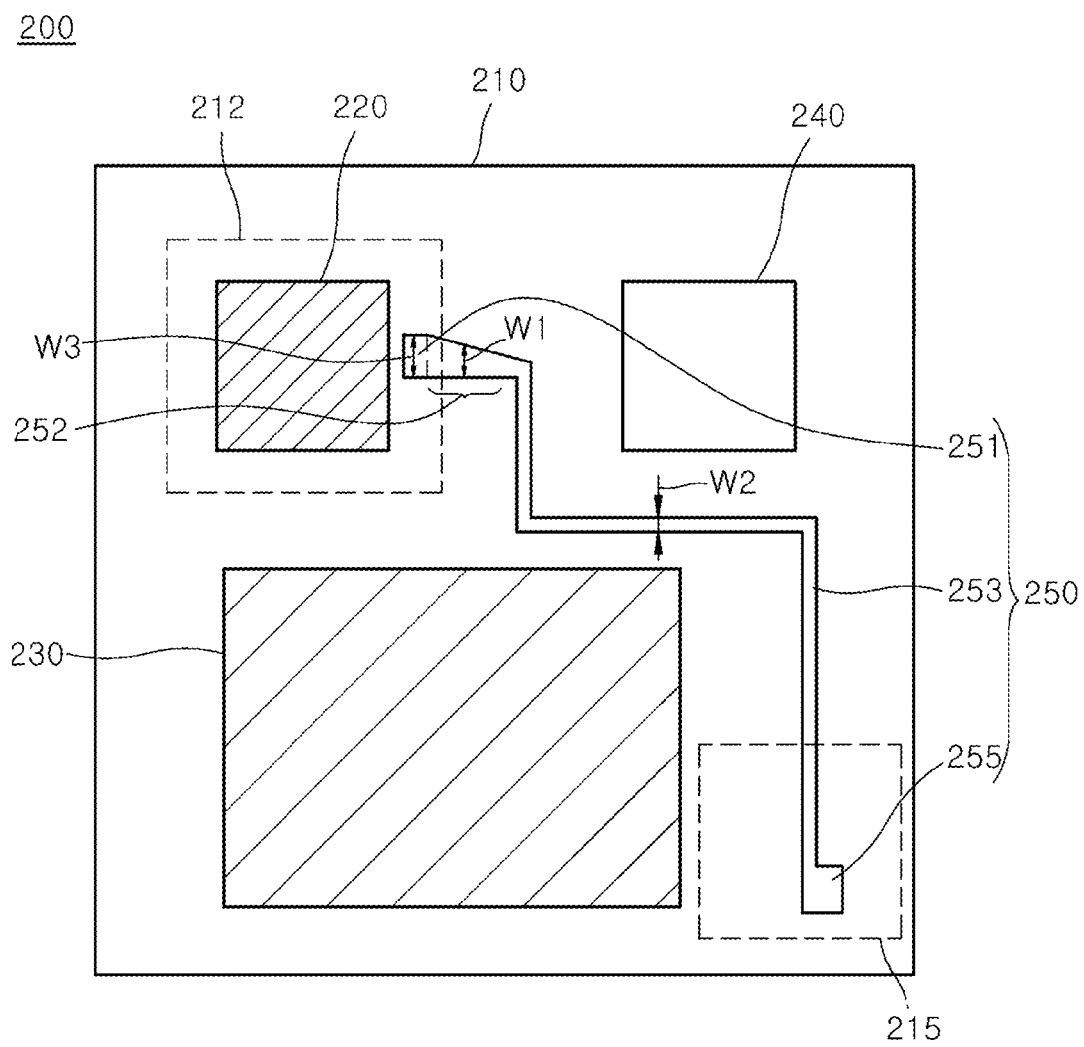
FIG. 3 is a plan view illustrating a semiconductor package according to an embodiment.

FIG. 3 is a plan view illustrating a semiconductor package 200 according to an embodiment.

Referring to FIG. 3, the semiconductor package 200 may be configured to include a package substrate 210 and a thermal redistribution pattern 250 disposed on the package substrate 210. The semiconductor package 200 may further include a first semiconductor chip 220, a second semiconductor chip 230 and a third semiconductor chip 240 which are disposed on the package substrate 210 to be spaced apart from each other. The thermal redistribution pattern 250 may be disposed to transmit heat of a high temperature region 212 surrounding the first semiconductor chip 220 generating a relatively large amount of heat to a low temperature region 215 having a relatively low temperature. The thermal redistribution pattern 250 may include one end portion 251 disposed in the high temperature region 212 and the other end portion 255 disposed in the low temperature region 215. The thermal redistribution pattern 250 may further include an extension portion 253 which passes by the second semiconductor chip 230 and connects the one end portion 251 to the other end portion 255.

The one end portion 251 of the thermal redistribution pattern 250 may be connected to the extension portion 253 of the thermal redistribution pattern 250 through a joint portion 252. The one end portion 251 of the thermal redistribution pattern 250 may have a width W3 which is greater than a width W2 of the extension portion 253, and a width W1 of the joint portion 252 may be gradually reduced away from the one end portion 251 of the thermal redistribution pattern 250. In an embodiment, a portion of the joint portion 252 adjacent to the one end portion 251 may have substantially the same width (i.e., the width W3) as the one end portion 251, and another portion of the joint portion 252 adjacent to the extension portion 253 may have substantially the same width (i.e., the width W2) as the extension portion 253. The one end portion 251 of the thermal redistribution pattern 250 may have the width W3 which is greater than the width W2 of the extension portion 253 in order to increase an efficiency for collecting the heat of the high temperature region 212 and the first semiconductor chip 220. If the width W2 of the extension portion 253 increases, a heat conduction efficiency of the extension portion 253 may be improved. However, since a space occupied by the extension portion 253 is restricted, the extension portion 253 may have a limited width. In addition, since the extension portion 253 is disposed in an area between the first to third semiconductor chips 220, 230 and 240, the width W2 of the extension portion 253 may have a limited value.

As illustrated in FIG. 1, a joint portion 152 between the one end portion 151 and the extension portion 153 may have a uniform width which is substantially equal to a width of the extension portion 153 and less than a width of the one end portion 151. Thus, while the heat of the high temperature region 112 is transmitted to the low temperature region 115, the heat of the high temperature region 112 may be stagnant in the joint portion 152 to cause a bottleneck phenomenon of heat transmission. To solve the bottleneck phenomenon occurring in the joint portion 152 of the thermal redistribution pattern 150, the joint portion 252 may be designed such that a portion of the joint portion 252 adjacent to the one end portion 251 has substantially the same width as the one end portion 251 and the width W1 of the joint portion 252 is gradually reduced away from the one end portion 251, as illustrated in FIG. 3. Since the width W1 of the joint portion 252 is gradually reduced from the width W3 to the width W2 toward the extension portion 253, a bottleneck phenomenon occurring in the joint portion 252 may be effectively relieved or suppressed.

Figure 4:
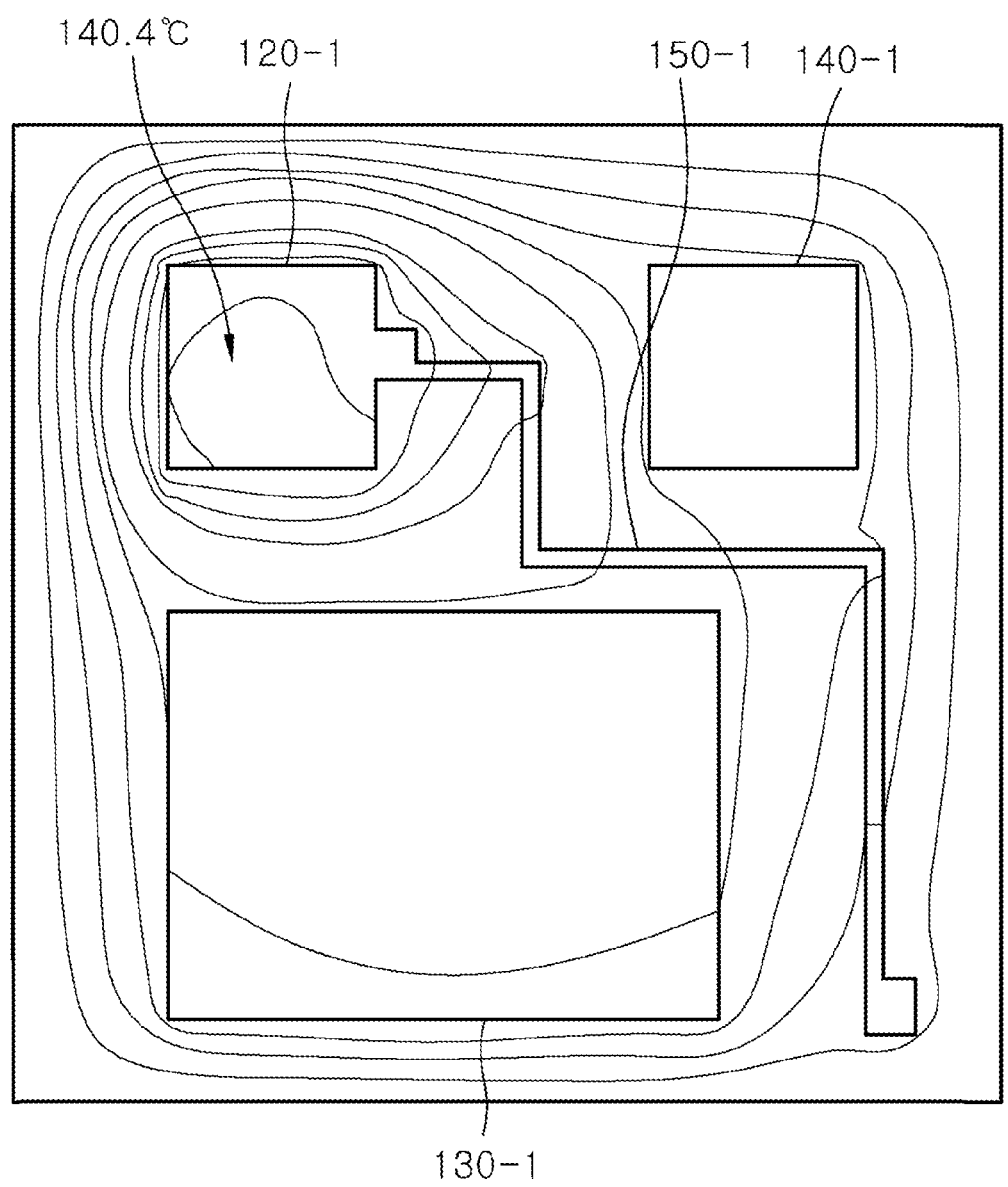
FIGS. 4 to 6 illustrate heat distribution in various semiconductor packages.
Figure 5:
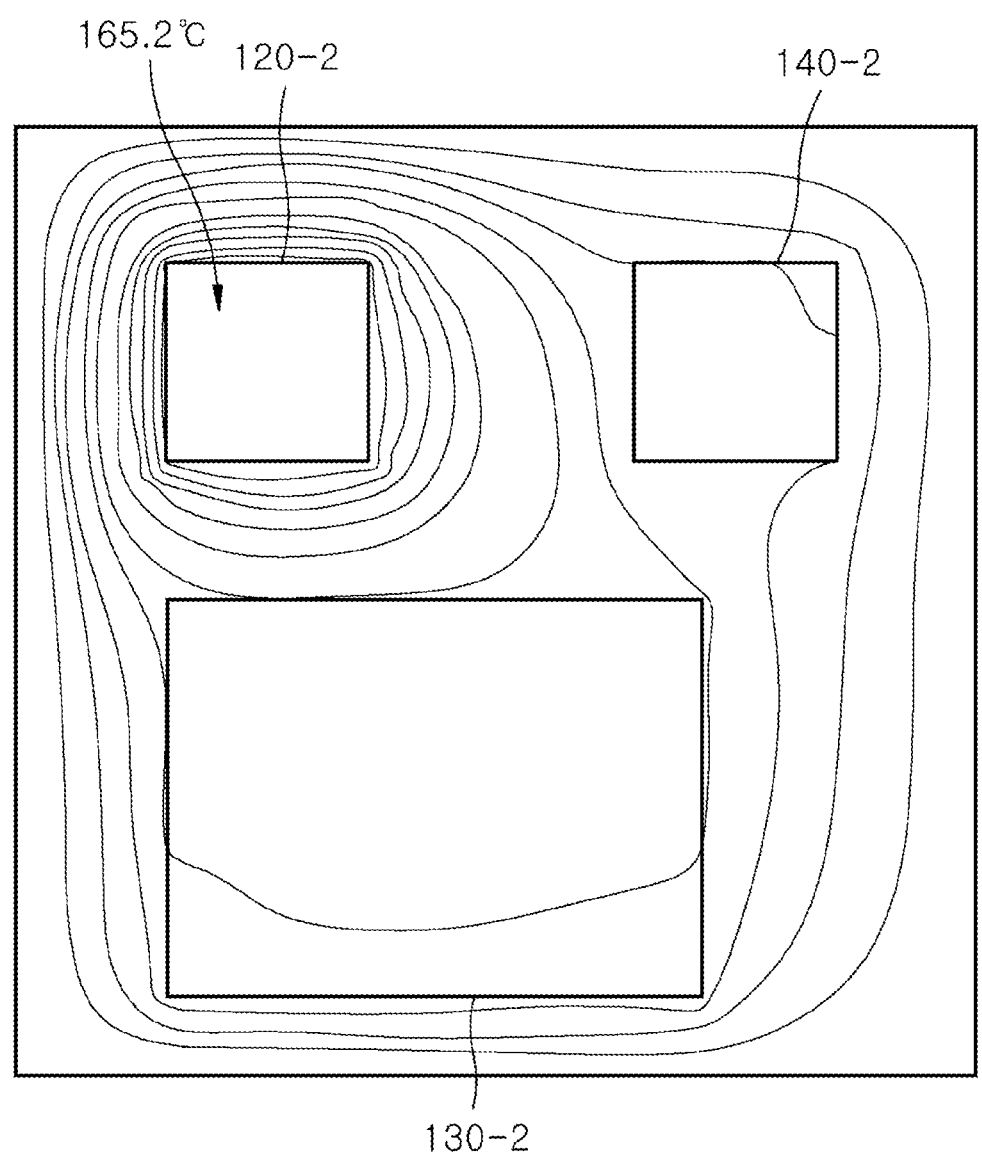
Figure 6:
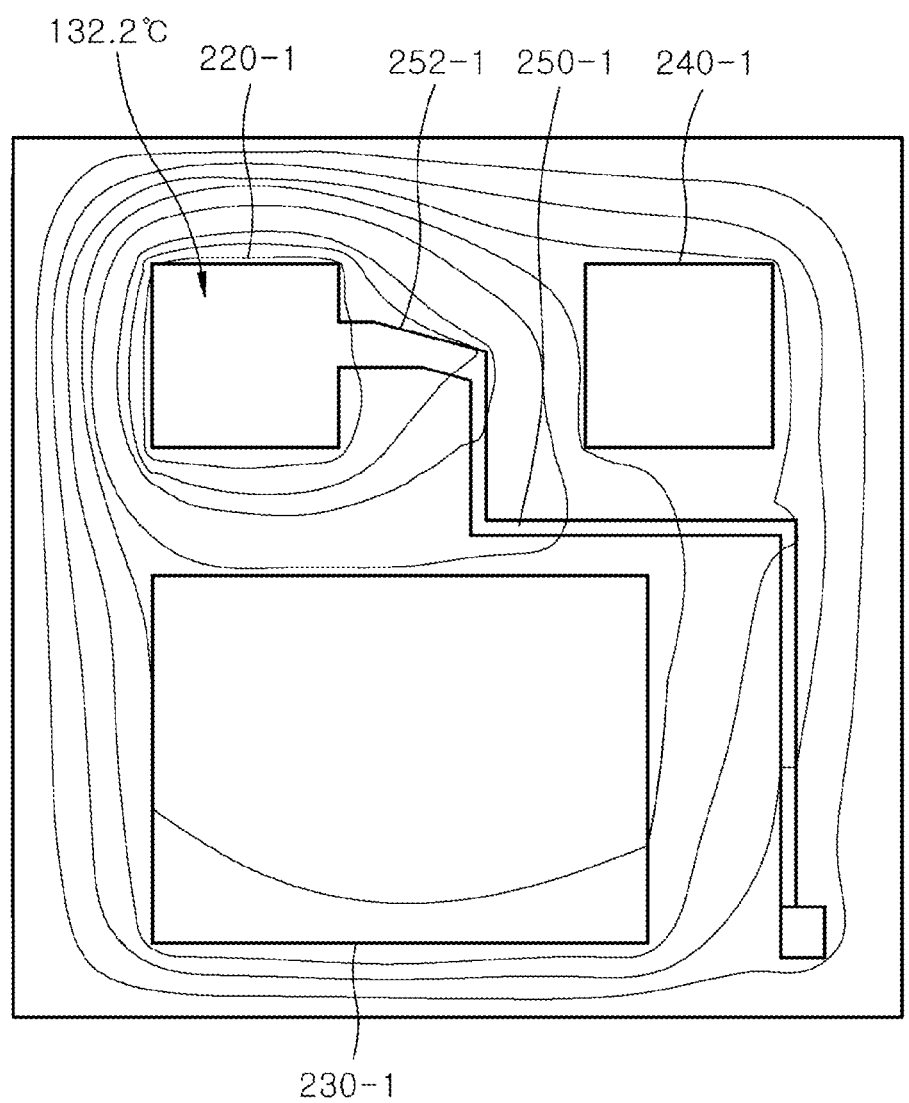

FIGS. 4 to 6 illustrate simulation results of heat distribution in various semiconductor packages.

FIG. 4 illustrates a thermal analysis simulation result of heat distribution in a semiconductor package including a first semiconductor chip 120-1, a second semiconductor chip 130-1, a third semiconductor chip 140-1 and a thermal redistribution pattern 150-1. It is assumed that a semiconductor package used in the simulation for obtaining the heat distribution illustrated in FIG. 4 has the same configuration as the semiconductor package 100 illustrated in FIG. 1. FIG. 5 illustrates a thermal analysis simulation result of heat distribution in a semiconductor package including a first semiconductor chip 120-2, a second semiconductor chip 130-2 and a third semiconductor chip 140-2 without any thermal redistribution pattern.

The heat distribution illustrated in FIG. 5 corresponds to an example in which a temperature of a region surrounding the first semiconductor chip 120-2 rises up to 165.2 degrees Celsius. In contrast, the heat distribution illustrated in FIG. 4 corresponds to an example in which a temperature of a region surrounding the first semiconductor chip 120-1 is lowered to 140.4 degrees Celsius due to the presence of the thermal redistribution pattern 150-1. Consequently, it can be understood that the heat in the region surrounding the first semiconductor chip 120-1 is transmitted to another region through the thermal redistribution pattern 150-1.

FIG. 6 illustrates a thermal analysis simulation result of heat distribution in a semiconductor package including a first semiconductor chip 220-1, a second semiconductor chip 230-1, a third semiconductor chip 240-1 and a thermal redistribution pattern 250-1. It is assumed that a semiconductor package used in the simulation for obtaining the heat distribution illustrated in FIG. 6 has the same configuration as the semiconductor package 200 illustrated in FIG. 3. The heat distribution illustrated in FIG. 6 corresponds to an example in which a temperature of a region surrounding the first semiconductor chip 220-1 is lowered to 132.2 degrees Celsius due to the presence of the thermal redistribution pattern 250-1. Meanwhile, according to the heat distribution illustrated in FIG. 4, the region surrounding the first semiconductor chip 120-1 exhibits a temperature of 140.4 degrees Celsius due to the presence of the thermal redistribution pattern 150-1. Accordingly, it can be understood that the thermal redistribution pattern 250-1 including a joint portion 252-1 is more effective in redistribution of heat generated in the semiconductor package as compared with the thermal redistribution pattern 150-1.

Figure 7:
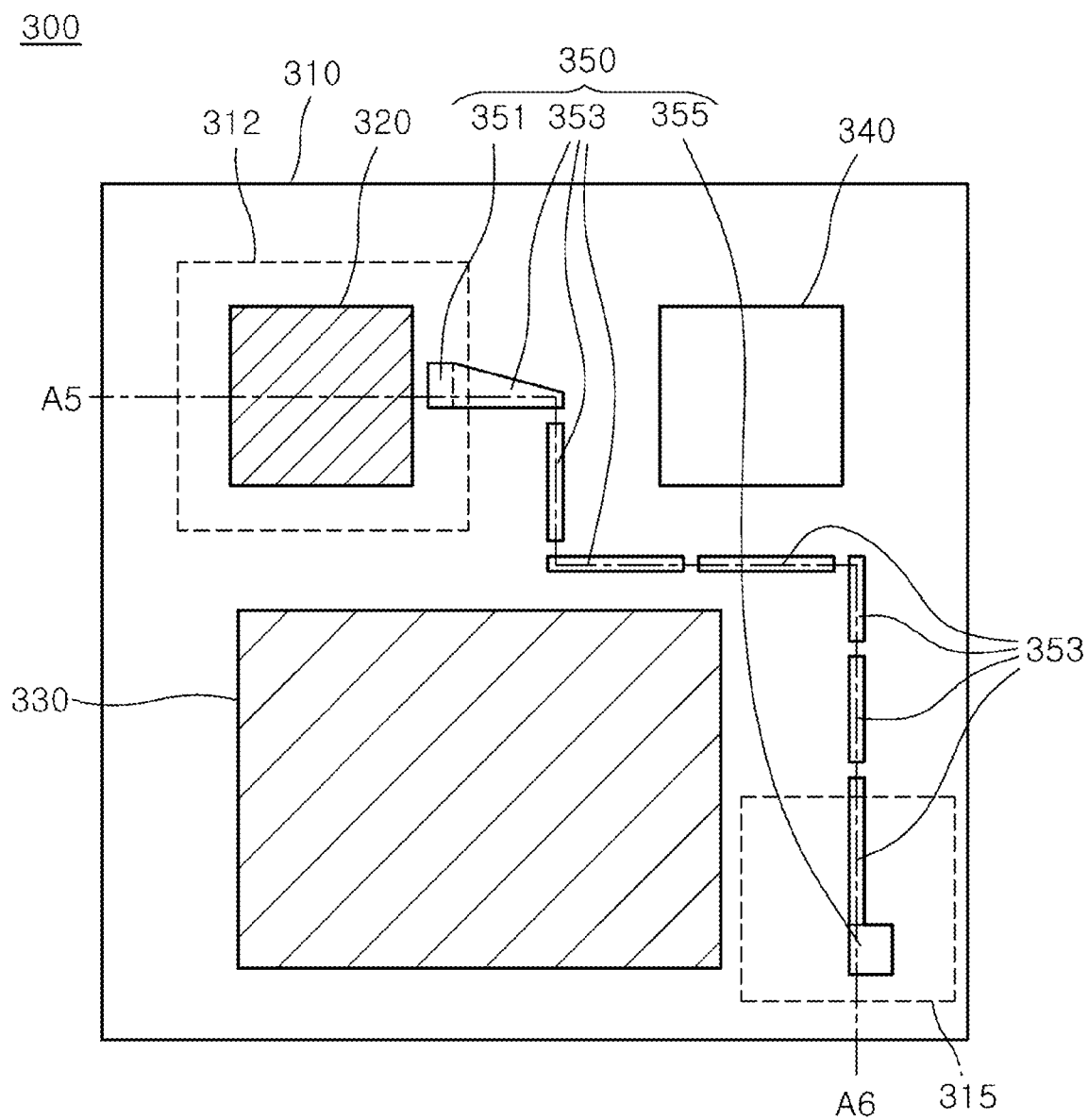
FIG. 7 is a plan view illustrating a semiconductor package according to an embodiment.
Figure 8:
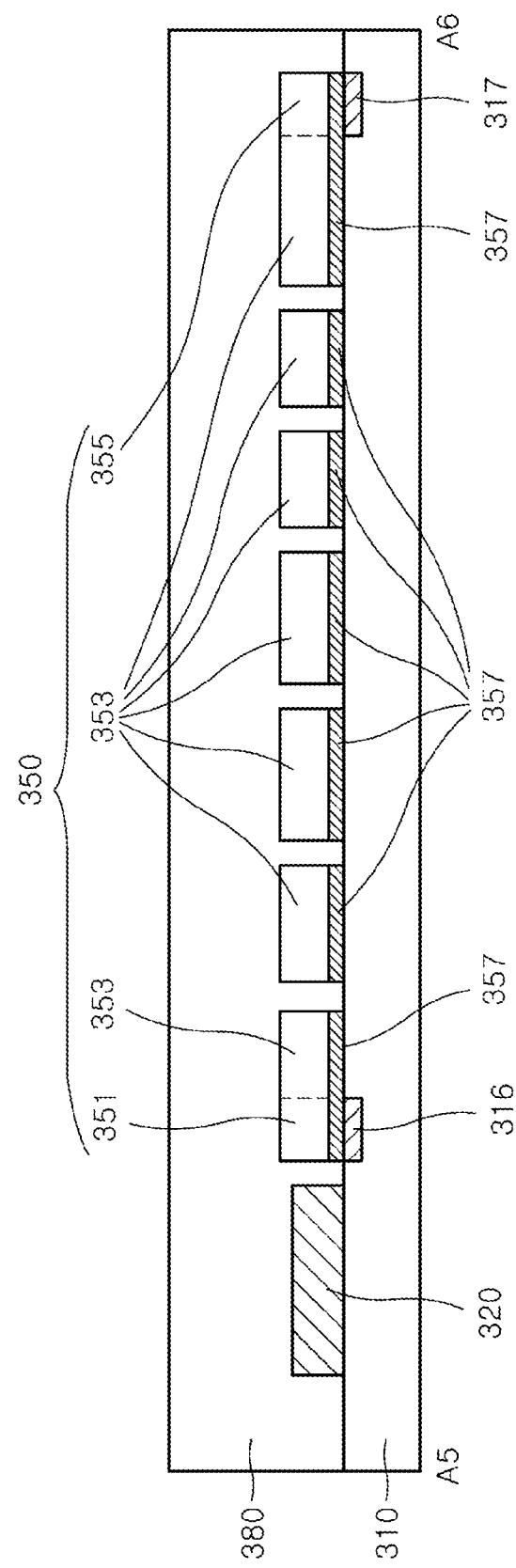
FIG. 8 is a cross-sectional view taken along line A5-A6 of FIG. 7.

FIG. 7 is a plan view illustrating a semiconductor package 300 according to an embodiment. FIG. 8 is a cross-sectional view taken along line A5-A6 of FIG. 7.

Referring to FIGS. 7 and 8, the semiconductor package 300 may be configured to include a package substrate 310 and a thermal redistribution pattern 350 disposed on the package substrate 310. The semiconductor package 300 may further include a first semiconductor chip 320, a second semiconductor chip 330 and a third semiconductor chip 340 which are disposed on the package substrate 310 to be spaced apart from each other. The thermal redistribution pattern 350 may be disposed to transmit heat of a high temperature region 312 surrounding the first semiconductor chip 320 generating a relatively large amount of heat to a low temperature region 315 having a relatively low temperature.

The thermal redistribution pattern 350 may include one end portion 351 disposed in the high temperature region 312 and the other end portion 355 disposed in the low temperature region 315. The thermal redistribution pattern 350 may further include a plurality of sub-extension portions 353 which are arrayed between the one end portion 351 and the other end portion 355 to be spaced part from each other. The sub-extension portions 353 may be arrayed along a path between the one end portion 351 and the other end portion 355. The sub-extension portions 353 may detour and pass by the second semiconductor chip 330.

The one end portion (i.e. a first end portion) 351 of the thermal redistribution pattern 350 may be bonded to the first mounting pattern 316 using a adhesive layer 357. The other end portion (i.e. second end portion) 355 of the thermal redistribution pattern 350 may be bonded to the second mounting pattern 317 using the adhesive layer 357. The sub-extension portions 353 of the thermal redistribution pattern 350 may be bonded or attached on the package substrate 110 using the adhesive layer 357. The adhesive layer 357 may include an adhesive material in which heat conductive beads such as silver beads are dispersed. The adhesive layer 357 may include a thermal interface material (TIM).

A molding layer 380 may be disposed to cover the first, second and third semiconductor chips 320, 340 and 350 on the package substrate 110.

Figure 9:
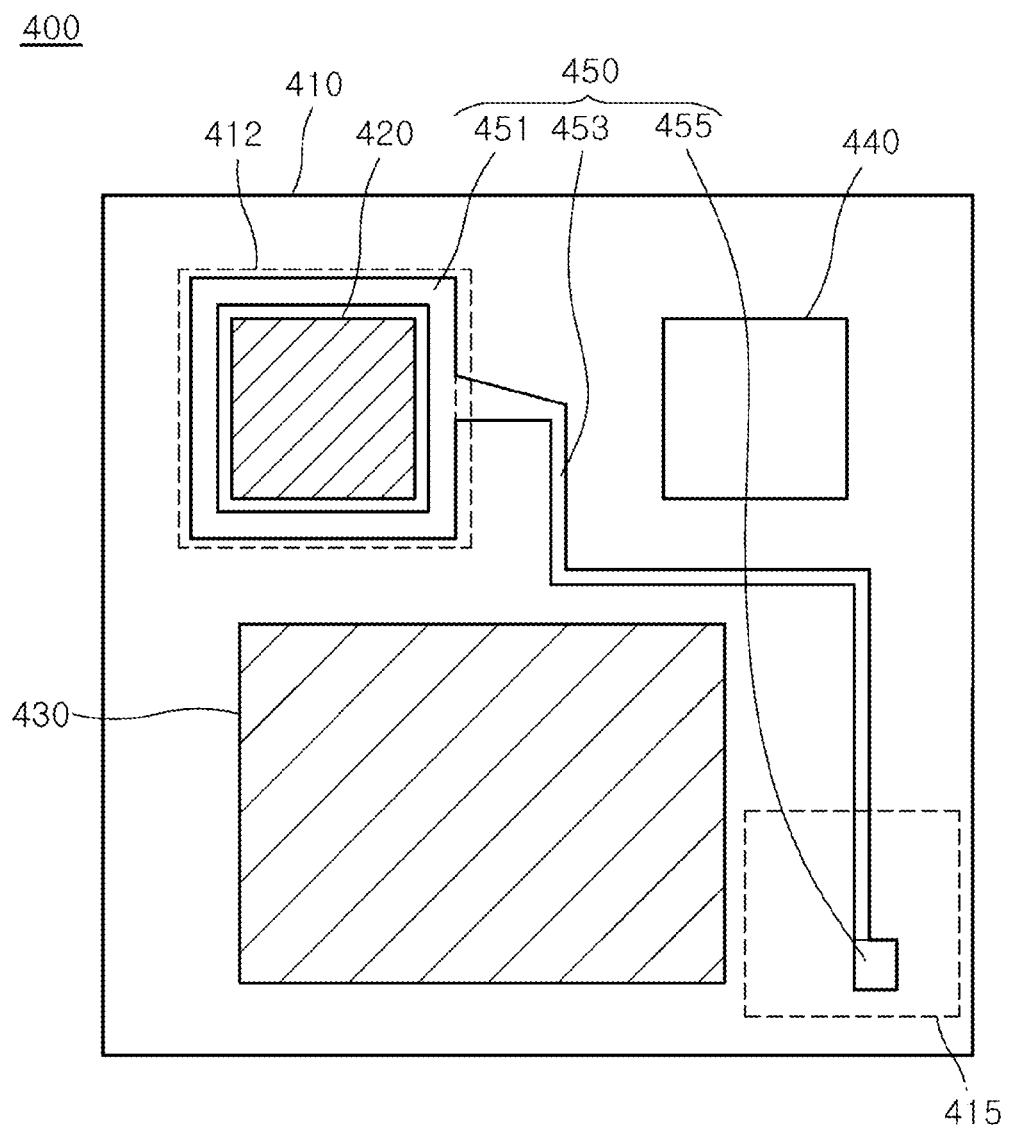
FIG. 9 is a plan view illustrating a semiconductor package according to an embodiment.

FIG. 9 is a plan view illustrating a semiconductor package 400 according to an embodiment.

Referring to FIG. 9, the semiconductor package 400 may be configured to include a package substrate 410 and a thermal redistribution pattern 450 disposed on the package substrate 410. The semiconductor package 400 may further include a first semiconductor chip 420, a second semiconductor chip 430 and a third semiconductor chip 440 which are disposed on the package substrate 410 to be spaced apart from each other. The thermal redistribution pattern 450 may be disposed to transmit heat of a high temperature region 412 surrounding the first semiconductor chip 420 generating a relatively large amount of heat to a low temperature region 415 having a relatively low temperature.

The thermal redistribution pattern 450 may include one end portion 451 disposed in the high temperature region 412 and the other end portion 455 disposed in the low temperature region 415. The one end portion 451 of the thermal redistribution pattern 450 may have a closed loop shape to surround the first semiconductor chip 420 in a plan view. Thus, an area of an inner side surface of the one end portion 451 facing the first semiconductor chip 420 may increase, and an amount of heat collected into the one end portion 451 may also increase to further improve a heat conduction efficiency of the thermal redistribution pattern 450. The thermal redistribution pattern 450 may further include an extension portion 453 which passes by the second semiconductor chip 430 and connects the one end portion 451 to the other end portion 455. In some other embodiments, a joint portion having the same configuration as the joint portion 252 described with reference to FIG. 3 may be additionally disposed between the one end portion 451 and the extension portion 453.

As described above, a semiconductor package according to any one of the above embodiments may include a thermal redistribution pattern that transmits heat in a high temperature region surrounding a high power chip generating a relatively large amount of heat to a low temperature region having a relatively low temperature. That is, according to the embodiments, heat in the high temperature region may be rapidly transmitted to the low temperature region through the thermal redistribution pattern to quickly lower a temperature of the high temperature region. Thus, the thermal redistribution pattern may prevent a specific region in the semiconductor package from being excessively heated up to form a hot spot. As a result, an overall thermal performance of the semiconductor package may be improved.

Figure 10:
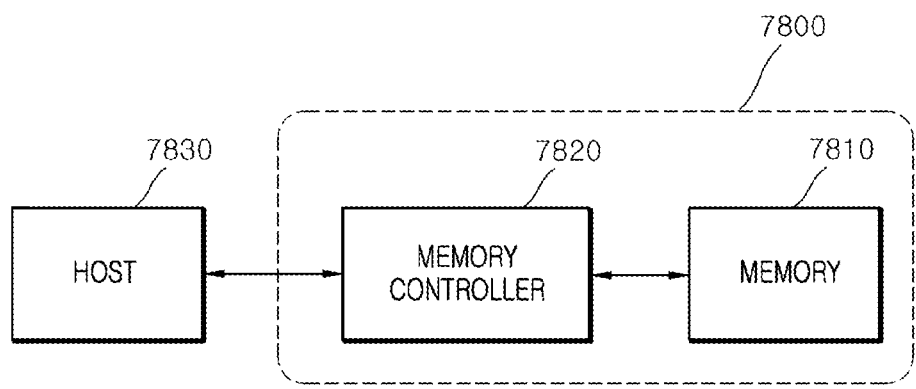
FIG. 10 is a block diagram illustrating an electronic system employing a memory card including a semiconductor package according to an embodiment.

FIG. 10 is a block diagram illustrating an electronic system including a memory card 7800 employing at least one of the semiconductor packages according to the embodiments. The memory card 7800 may include a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 11:
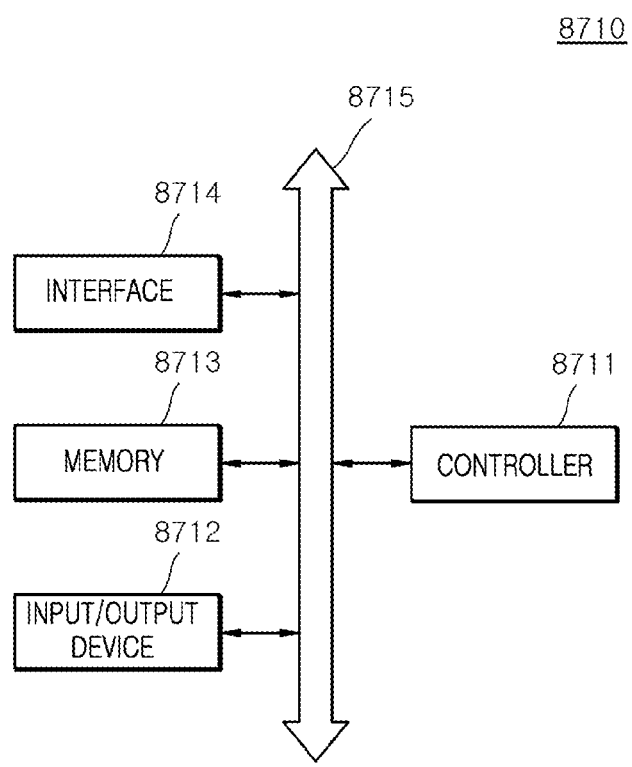
FIG. 11 is a block diagram illustrating an electronic system including a semiconductor package according to an embodiment.

FIG. 11 is a block diagram illustrating an electronic system 8710 including at least one of the semiconductor packages according to the embodiments. The electronic system 8710 may include a controller 8711, an input/output unit 8712 and a memory 8713. The controller 8711, the input/output unit 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output unit 8712 may include at least one selected from a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system with a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
a first semiconductor chip and a second semiconductor chip disposed side by side on a package substrate; and
a thermal redistribution pattern including a first end portion, a second end portion and an extension portion,
the first end portion disposed over a high temperature region adjacent to the first semiconductor chip,
the second end portion disposed over a low temperature region adjacent to the second semiconductor chip, and
the extension portion extending horizontally over the package substrate between the first end portion and the second end portion and passing by the second semiconductor chip to detour the second semiconductor chip.

2. The semiconductor package of claim 1, wherein the first end portion of the thermal redistribution pattern is spaced apart from the first semiconductor chip.

3. The semiconductor package of claim 2, wherein a side surface of the first end portion of the thermal redistribution pattern faces a side surface of the first semiconductor chip.

4. The semiconductor package of claim 1, wherein a side surface of the first end portion of the thermal redistribution pattern is in contact with a side surface of the first semiconductor chip.

5. The semiconductor package of claim 1, further comprising a molding layer which is formed on the package substrate to cover the thermal redistribution pattern,
wherein the molding layer fills a gap between the extension portion of the thermal redistribution pattern and the package substrate to surround the extension portion.

6. The semiconductor package of claim 5, wherein the thermal redistribution pattern has a thermal conductivity which is higher than a thermal conductivity of the molding layer.

7. The semiconductor package of claim 6, wherein the thermal redistribution pattern includes a metal material containing copper.

8. The semiconductor package of claim 7, wherein the molding layer electrically insulates the extension portion of the thermal redistribution patterns from the package substrate.

9. The semiconductor package of claim 1, wherein the high temperature region includes the first semiconductor chip and the low temperature region does not include a semiconductor chip.

10. The semiconductor package of claim 1, wherein the first end portion of the thermal redistribution pattern has a width which is greater than a width of the extension portion of the thermal redistribution pattern.

11. The semiconductor package of claim 10,
wherein the thermal redistribution pattern further includes a joint portion disposed between the first end portion and the extension portion; and
wherein a width of the joint portion of the thermal redistribution pattern is reduced in a direction from the first end portion to the extension portion.

12. The semiconductor package of claim 11,
wherein the thermal redistribution pattern further includes a joint portion disposed between the first end portion and the extension portion, and
wherein a width of the joint portion of the thermal redistribution pattern is substantially uniform.

13. The semiconductor package of claim 12, wherein the width of the joint portion of the thermal redistribution pattern is substantially equal to the width of the extension portion and less than the width of the first end portion.

14. The semiconductor package of claim 1, wherein the first end portion of the thermal redistribution pattern has a closed loop shape surrounding the first semiconductor chip.

15. The semiconductor package of claim 1, wherein electric power consumed by the first semiconductor chip is greater than electric power consumed by the second semiconductor chip.

16. The semiconductor package of claim 1, wherein a distance between the low temperature region and the first semiconductor chip is greater than a distance between the second semiconductor chip and the first semiconductor chip.

17. The semiconductor package of claim 1, wherein a thickness of the thermal redistribution pattern is substantially equal to or less than a thickness of the thickest one of either the first or second semiconductor chips.

18. The semiconductor package of claim 1, wherein the low temperature region is located in a corner region of the semiconductor package that is located farthest from the first semiconductor chip.

19. A semiconductor package comprising:
a first semiconductor chip and a second semiconductor chip disposed side by side on a package substrate; and
a thermal redistribution pattern including a first end portion, a second end portion and a plurality of sub-extension portions,
the first end portion disposed over a high temperature region adjacent to the first semiconductor chip,
the second end portion disposed over a low temperature region adjacent to the second semiconductor chip,
the plurality of sub-extension portions arrayed along a path with extending horizontally over the package between the first end portion and the second end portion,
the plurality of sub-extension portions arrayed to pass by the second semiconductor chip to detour the second semiconductor chip, and
the plurality of sub-extension portions spaced part from each other.

20. A semiconductor package comprising:
a first semiconductor chip and a second semiconductor chip disposed side by side on a package substrate; and
a thermal redistribution pattern including a first end portion, a second end portion and an extension portion,
the first end portion disposed adjacent to the first semiconductor chip,
the second end portion disposed adjacent to the second semiconductor chip,
the extension portion connected to the first end portion and the second end portion, and configured to reduce a bottleneck phenomenon of heat transmission when transferring heat from the first end portion to the second end portion, and
the extension portion extending horizontally over the package substrate and passing by the second semiconductor chip to detour the second semiconductor chip.

* * * * *

UNITED STATES PATENT AND TRADEMARK OFFICE
CERTIFICATE OF CORRECTION

PATENT NO. : 10,714,405 B2  
APPLICATION NO. : 16/529548  
DATED : July 14, 2020  
INVENTOR(S) : Dae Woong Lee Page 1 of 1

It is certified that error appears in the above-identified patent and that said Letters Patent is hereby corrected as shown below:

On the Title Page

Item (71) Applicant:
Replace "SK hynix Inc., Incheon-si, Gyeonggi-do (KR)" with --SK hynix Inc., Icheon-si, Gyeonggi-do (KR)--

Signed and Sealed this
Eighteenth Day of August, 2020

Andrei Iancu
*Director of the United States Patent and Trademark Office*